(12) United States Patent
Darmawikarta et al.

(10) Patent No.: US 12,334,447 B2
(45) Date of Patent: Jun. 17, 2025

(54) LITHOGRAPHICALLY DEFINED VERTICAL INTERCONNECT ACCESS (VIA) FOR A BRIDGE DIE FIRST LEVEL INTERCONNECT (FLI)

(71) Applicant: Intel Corporation, Santa Clara, CA (US)

(72) Inventors: Kristof Darmawikarta, Chandler, AZ (US); Tarek Ibrahim, Mesa, AZ (US); Siddharth Alur, Chandler, AZ (US); Rahul Jain, Gilbert, AZ (US); Haobo Chen, Gilbert, AZ (US)

( * ) Notice: Subject to any disclaimer, the term of this patent is extended or adjusted under 35 U.S.C. 154(b) by 961 days.

(21) Appl. No.: 16/455,688

(22) Filed: Jun. 27, 2019

(65) Prior Publication Data

US 2020/0411441 A1 Dec. 31, 2020

(51) Int. Cl.
*H01L 23/522* (2006.01)
*H01L 21/768* (2006.01)
(Continued)

(52) U.S. Cl.
CPC .... *H01L 23/5384* (2013.01); *H01L 21/76897* (2013.01); *H01L 23/5381* (2013.01); *H01L 23/5386* (2013.01); *H01L 24/06* (2013.01)

(58) Field of Classification Search
CPC ........... H01L 23/5384; H01L 21/76897; H01L 23/5381; H01L 23/5386; H01L 24/06; H01L 24/13; H01L 24/16; H01L 25/0655; H01L 23/49816; H01L 23/5383; H01L 24/81; H01L 2224/16238; H01L 2224/81192; H01L 2924/15331; H01L 23/5385; H01L 23/49822; H01L 21/4853; H01L 21/4857; H01L 21/486; H01L 23/49811; H01L 23/49827; H01L 2224/16148; H01L 2224/16165; H01L 28/20; H01L 28/40; H01L 2224/16225; H01L 2224/131; H01L 2224/16227; H01L 23/15; H01L 23/147; H01L 2224/16235; H01L 23/13; H01L 25/16; H01L 25/18;

(Continued)

(56) References Cited

U.S. PATENT DOCUMENTS

2014/0102772 A1* 4/2014 Chen ................ H05K 3/4602
                                                 29/843
2014/0353827 A1* 12/2014 Liu .................... H01L 25/18
                                                 257/774

(Continued)

*Primary Examiner* — Samuel Park
(74) *Attorney, Agent, or Firm* — Haley Guiliano LLP

(57) ABSTRACT

Embodiments described herein relate to lithographically defined vertical interconnect accesses (litho-vias) for a bridge die first level interconnect (FLI) and techniques of fabricating such litho-vias. In one example, a package substrate comprises a bridge die embedded in the package substrate; a first contact pad outside a perimeter of the bridge die; a second contact pad inside the perimeter of the bridge die and coupled to the bridge die by a first via; a third pad inside the perimeter of the bridge die, adjacent to the second contact pad, and coupled to the bridge die by a second via. The first contact pad has a surface finish disposed thereon. A first protruded interconnect structure is positioned on the first via and a second protruded interconnect structure is positioned on the second via. Each of the first and second vias have sidewalls that are substantially vertical.

23 Claims, 9 Drawing Sheets

(51) Int. Cl.
*H01L 23/00* (2006.01)
*H01L 23/538* (2006.01)

(58) Field of Classification Search
CPC ..... H01L 23/538; H01L 23/64; H01L 23/642; H01L 23/647; H01L 25/50; H01L 2924/15192; H05K 1/181
See application file for complete search history.

(56) References Cited

U.S. PATENT DOCUMENTS

| | | | |
|---|---|---|---|
| 2015/0048515 A1* | 2/2015 | Zhang | H01L 25/0655 257/774 |
| 2017/0271277 A1* | 9/2017 | Shuto | H01L 25/117 |
| 2018/0174972 A1* | 6/2018 | Weng | H01L 23/552 |
| 2018/0261545 A1* | 9/2018 | Sundaram | H01L 24/16 |
| 2019/0295925 A1* | 9/2019 | Yang | H01L 21/4853 |
| 2019/0393297 A1* | 12/2019 | Kung | H01L 23/3171 |

\* cited by examiner

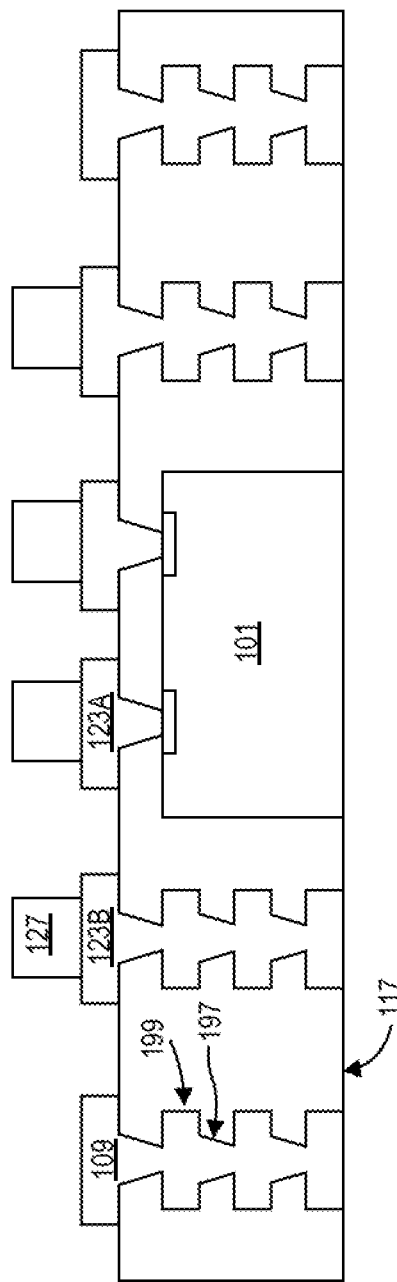
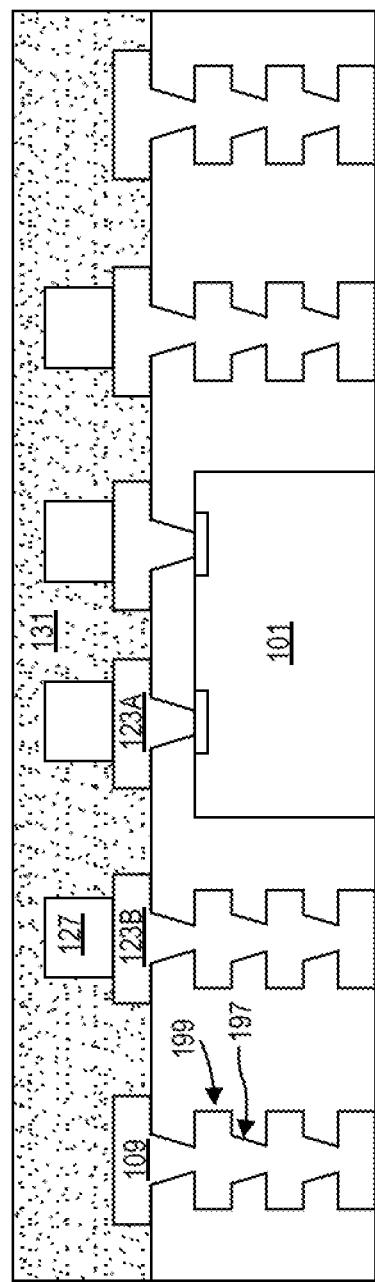

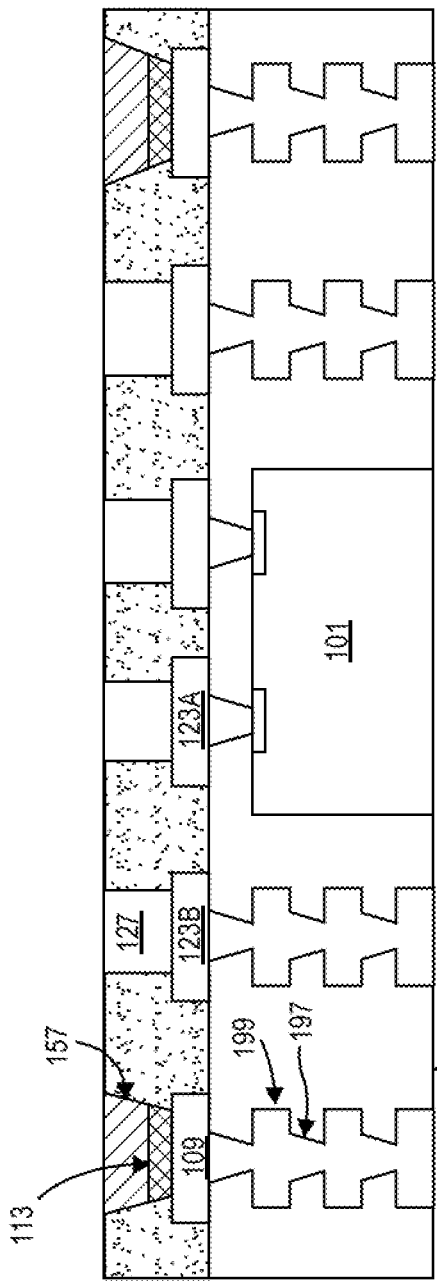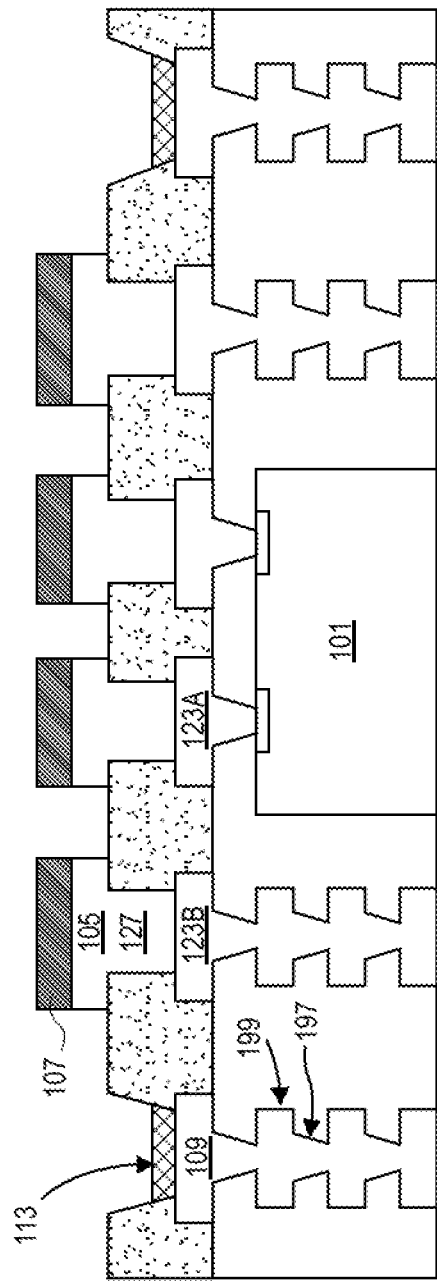

LITHOGRAPHICALLY DEFINED VERTICAL
INTERCONNECT ACCESS (VIA) FOR A
BRIDGE DIE FIRST LEVEL
INTERCONNECT (FLI)

BACKGROUND

Field

Embodiments described herein generally relate to semiconductor packaging. More particularly, embodiments described herein relate to lithographically defined vertical interconnect accesses (litho-vias) for a bridge die first level interconnect (FLI) and techniques of forming such litho-vias.

Background Information

A semiconductor package may include one or more semiconductor dies coupled to a package substrate by a first level interconnect (FLI) that comprises protruded interconnect structures (e.g., pillars, bumps, etc.). For example, an FLI couples contact pads of one or more semiconductor dies to contact pads of a package substrate. A semiconductor package may also include a bridge die, which is comprised of routing layers, embedded in a package substrate. The bridge die electrically couples semiconductor dies on the package substrate via an FLI. For example, an FLI couples contact pads of multiple semiconductor dies on a package substrate to contact pads on the package substrate that are coupled to a bridge die in the package substrate.

Generally, exposed surfaces of a package substrate's contact pads are coated with a surface finish before a component (e.g., capacitor, etc.) or an FLI is positioned on the package substrate's contact pads. However, in a semiconductor package that includes a bridge die, due to reliability concerns, the FLIs that couples semiconductor dies to the bridge die need to be positioned directly on the contact pads of the package substrate that are coupled to the bridge die. That is, the package substrate's contact pads that are coupled to the bridge die should not have a surface finish thereon before an FLI is positioned on the contact pads. The process of interconnecting semiconductor dies with a bridge die includes: (i) forming solder resist openings (SROs) in a solder resist (SR) layer of a package substrate using laser drilling techniques (e.g., ultraviolet (UV) laser drilling technique, etc.), where the SROs are positioned above the bridge die; and (ii) forming vertical interconnect accesses (vias) in the SROs. These vias are referred to herein as laser drilled vias. The SROs above the bridge die expose contact pads of the package substrate that are coupled to the bridge die. The laser drilled vias formed in the SROs are electrically conductive microelectronic structures that electrically couple structures between the laser drilled vias. The laser drilled vias interface with the FLI to couple semiconductor dies to the bridge die.

As pitches in bridge die architecture scale to less than 50 microns (μm), forming the laser drilled vias above the bridge die is becoming challenging. This is at least because there is a limit to the minimum dimension of laser drilled vias above a bridge die that can be achieved using laser drilling techniques. For example, laser drilling techniques cannot achieve pitches for laser drilled vias above the bridge die that are less than 50 μm.

Additionally, laser drilled vias that are above the bridge die exhibit laser-induced tapering. That is, each of the laser drilled vias that are above the bridge die has a V-shape with a top that is wider than its bottom. As sizes of pitches for laser drilled vias above a bridge die decrease, the reduction in the width of the bottom of the laser drilled vias' V-shape can cause separation or delamination of protruded interconnect structures positioned in the laser drilled vias. For example, unwanted separation or delamination of a protruded interconnect structure positioned in a laser drilled via above a bridge die can occur when the laser drilled via's bottom diameter is below 16 μm. Thus, there is a concern over the mechanical reliability of laser drilled vias above a bridge die.

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

FIGS. 3A-3I illustrate cross sectional side views of a process of fabricating a package substrate that comprises litho-vias for a bridge die FLI, according to one embodiment.

DETAILED DESCRIPTION

Figure 1:
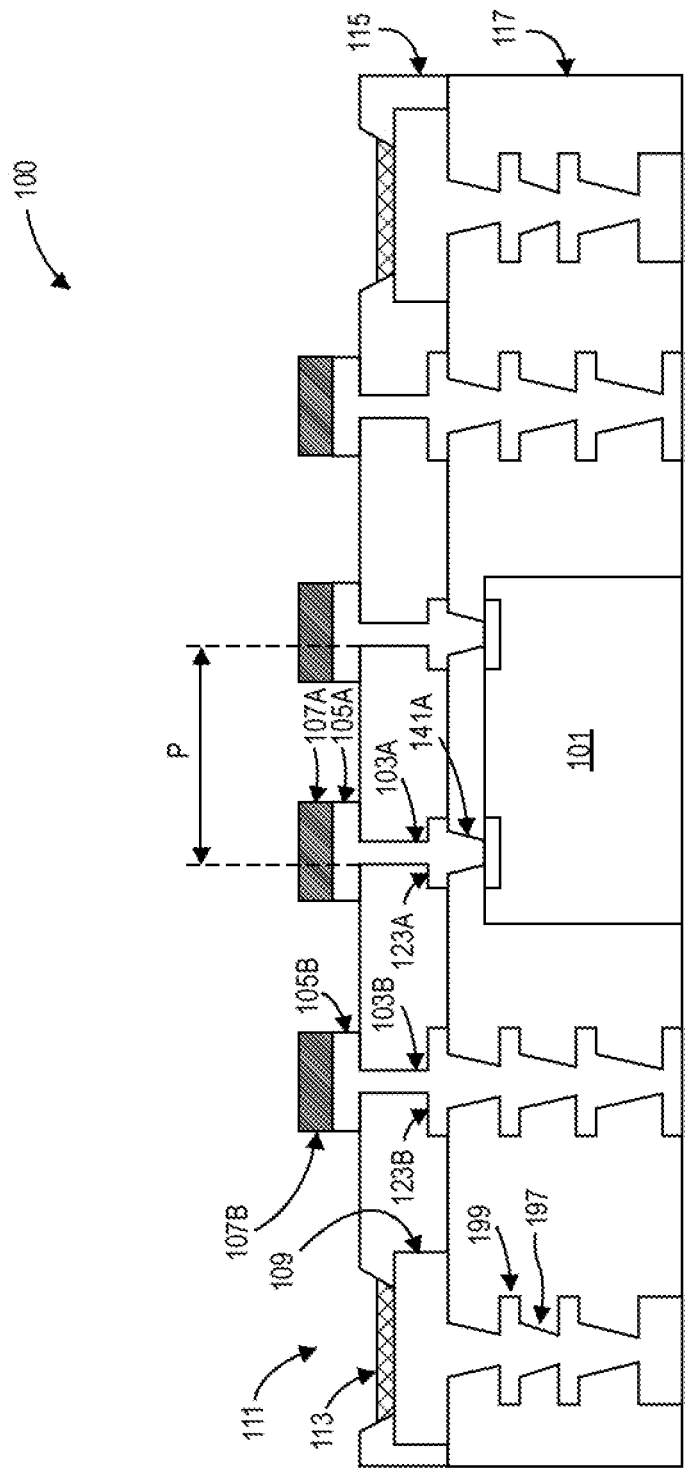
FIG. 1 illustrates a cross sectional side view of a package substrate comprising lithographically defined vertical interconnect accesses (litho-vias) for a bridge die first level interconnect (FLI), according to one embodiment.

In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, redistribution layers, conductive features (e.g., traces, etc.), are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein relate to lithographically defined vertical interconnect accesses (litho-vias) for a bridge die first level interconnect (FLI) and techniques of fabricating such litho-vias. The techniques of forming the litho-vias and the litho-vias themselves have many advantages. For example, the techniques of fabricating the litho-vias enable selective application of a surface finish on contact pads of the semiconductor package. This selective application can assist with eliminating application of surface finishes to contact pads associated with a bridge die that do not need surface finishes disposed thereon. Eliminating application of surface finishes to contact pads associated with the bridge die assists with improving the electrical connections between the bridge die and the semiconductor dies coupled to the bridge die, which in turn assists with reducing yield loss. Furthermore, the techniques described herein create litho-vias with finer pitches than laser drilled vias. Consequently, the number of interconnects between the semiconductor dies on a package substrate and the bridge die may be increased. Additionally, embodiments of the litho-vias described herein are characterized by sidewalls that are substantially vertical, which differs from the V-shaped laser drilled vias described above. Because the litho-vias replace laser drilled vias, the mechanical reliability problems associated with laser drilled vias are reduced or eliminated.

FIG. 1 illustrates a cross sectional side view of a package substrate 100 comprising litho-vias 103A-103B for a bridge die FLI 107A-107B, according to one embodiment. The package substrate 100 includes multiple layers 115 and 117; however, it is to be appreciated that the package substrate 100 may include any number of layers. That is, while layer 117 is shown as a single layer in FIG. 1, it is to be appreciated that layer 117 may comprise a plurality of laminated dielectric layers. In an embodiment, conductive features (e.g., pads 199, vias 197, traces, etc.) may be embedded in the layer 117 to provide conductive routing in the package substrate 100. The layer 115 may be an additional dielectric layer (e.g., a build-up layer, etc.) or a solder resist layer. For example, when the layer 115 is a dielectric layer, the layer 115 may be formed from an epoxy dielectric (e.g., an organic epoxy dielectric). In some embodiments, the layer 115 may be substantially similar to the layer(s) 117.

Referring again to FIG. 1, a bridge die 101 is embedded in the package substrate 100. In an embodiment, the bridge die 101 includes a substrate that enables fine line/spacing of conductive features in order to provide high density routing between dies. For example, the bridge die 101 may comprise silicon. The bridge die 101 may be used to couple two or more semiconductor dies to each other. One example of a bridge die is an embedded multi-die interconnect bridge die (EMIB).

The package substrate also includes protruded interconnect structures 107A-107B. Each of the protruded interconnect structures 107A-107B is an interconnect (e.g., a bump, a pillar, etc.) for coupling the package substrate 100 to a component (e.g., a semiconductor die, etc.). Each of the protruded interconnect structures 107A-107B may comprise nickel, tin, copper, any other suitable metal or alloy, or any combination thereof. In one embodiment, the bridge die 101, which is embedded in the layer 117, is coupled to two protruded interconnect structures 107A on the layer 115 via vias 141A, contact pads 123A, litho-vias 103A, and pads 105A. In one embodiment, the two protruded interconnect structures 107A are used to couple dies to the bridge die 101. In one embodiment, a pitch P between the two litho-vias 103A is less than 50 microns (μm). In one embodiment, the pitch P is less than or equal to 45 μm. Because the litho-vias 103A are capable of having finer pitches than laser drilled vias, an input/output (I/O) density associated with the bridge die 101 can be increased. Additionally, the litho-vias 103A-103B described above in connection with FIG. 1 are characterized by sidewalls that are substantially vertical, which differs from the V-shaped laser drilled vias described above. Because the litho-vias 103A-103B replace laser drilled vias, the mechanical reliability problems associated with laser drilled vias, which are described above, are reduced or eliminated.

The package substrate 100 also includes contact pads 123B in the layer 115. As shown, the contact pads 123B are coupled to protruded interconnect structures 107B on the layer 115 via litho-vias 103B and contact pads 105B. The protruded interconnect structures 107B can be used to couple semiconductor dies to structures or components in the layers 115 and 117. Each of the protruded interconnect structures 107B, the contact pads 123B, the litho-vias 103B, and the contact pads 105B are outside the perimeter of the bridge die 101. That is, each of the protruded interconnect structures 107B, the contact pads 123B, the litho-vias 103B, and the contact pads 105B do not overlap the bridge die 101 and are not above the bridge die 101.

As shown in FIG. 1, the layer 115 includes openings 111 that reveal contact pads 109. In one embodiment, each of the contact pads 109 is a die side pad (e.g., a die side capacitor pad, etc.). As shown each of the contact pads 109 has a surface finish 113 disposed thereon. The surface finish 113 can comprise electroless nickel immersion gold (ENIG), electroless nickel electroless gold (ENEG), electroless nickel electroless palladium immersion gold (ENEPIG), any other suitable surface finish, or any combination of suitable surface finishes.

As shown in FIG. 1, the surface finish 113 is disposed on the contact pads 109 but not on the contact pads 105A-105B. That is, the surface finish 113 is selectively applied to the contact pad 109 of the package substrate 100. This selective application can assist with eliminating application of the surface finish 113 to contact pads 105A-105B associated with the bridge die 101 that do not need surface finishes disposed thereon. Eliminating application of the surface finish 113 to contact pads 105A-105B associated with the bridge die 101 assists with improving the electrical connections between the bridge die 101 and the semiconductor dies (not shown in FIG. 1) coupled to the bridge die 101, which in turn assists with reducing yield loss.

Figure 2:
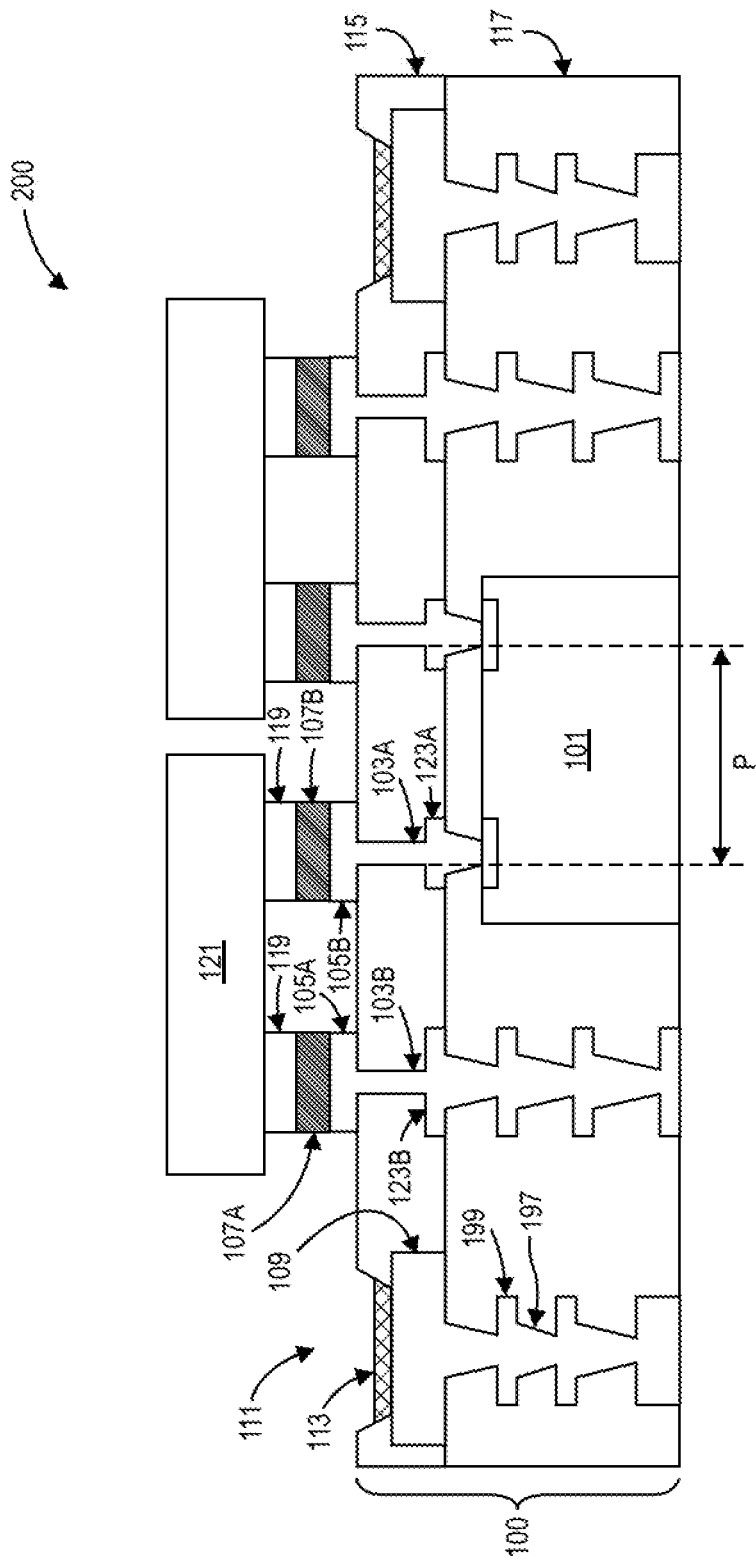
FIG. 2 illustrates a cross sectional side view of a semiconductor package comprising litho-vias for a bridge die FLI, according to one embodiment.

FIG. 2 illustrates a cross sectional view of a semiconductor package 200 comprising litho-vias 103A-103B for a bridge die FLI 107A-107B, according to one embodiment. The semiconductor package 200 includes the package substrate 100, which is described above in connection with FIG. 1. The semiconductor package 200 also includes two semiconductor dies 121 coupled to the package substrate 100 via the contact pads 105A-105B, the protruded interconnect structures 107A-107B, and the contact pads 119 of the semiconductor dies 121.

FIGS. 3A-3I illustrate cross sectional views of a process of fabricating a package substrate that comprises litho-vias for a bridge die FLI, according to one embodiment. With regard now to FIG. 3A, the starting structure 300 may comprise a package substrate, the contact pads 109, the contact pads 123A, and the contact pads 123B. Next, in FIG. 3B, a resist layer 129 (e.g., a dry film resist (DFR), etc.) is laminated on the package substrate, the contact pads 109, the contact pads 123A, and the contact pads 123B. Also, the resist layer 129 is lithographically processed to reveal openings 151 above the contact pads 123A and the contact pads 123B. It is to be appreciated that, in one embodiment, no openings in the resist layer 129 are formed over the contact pads 109.

Figure 3A:
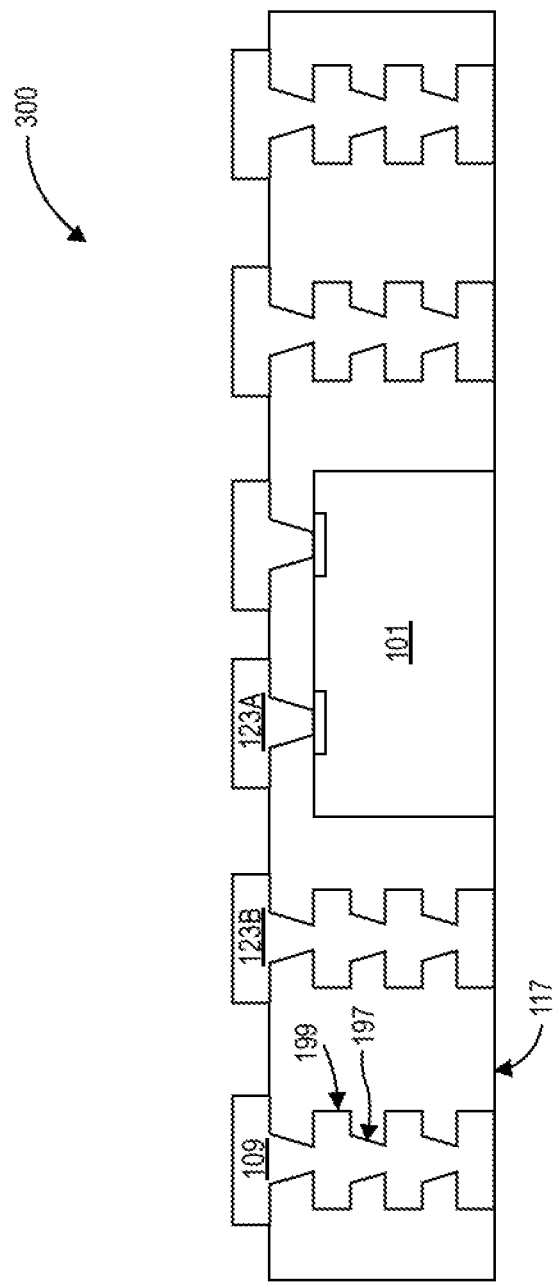
Figure 3B:
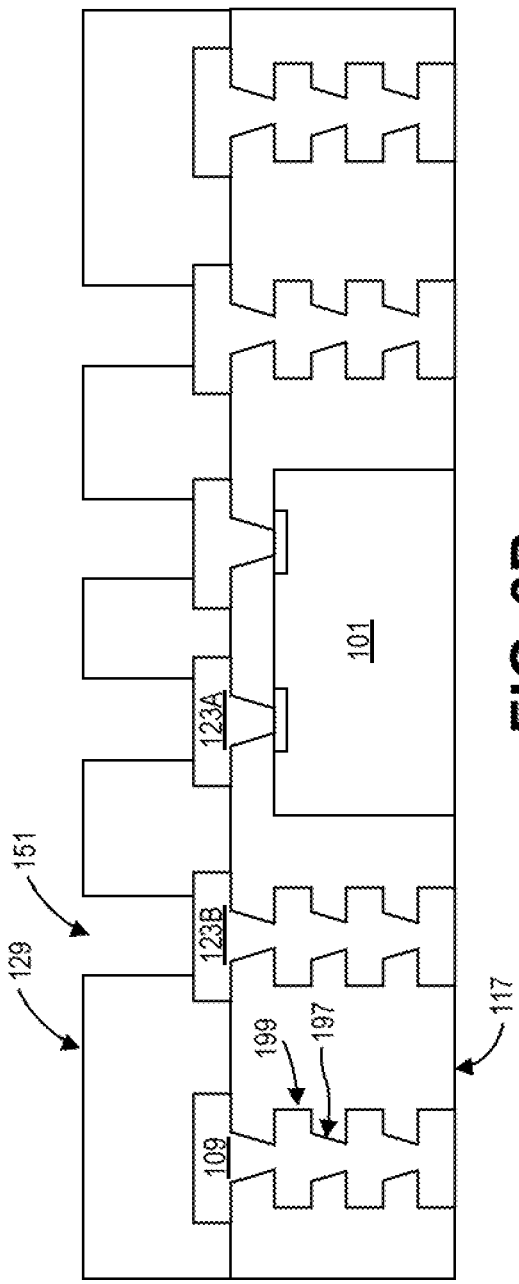
Figure 3C:
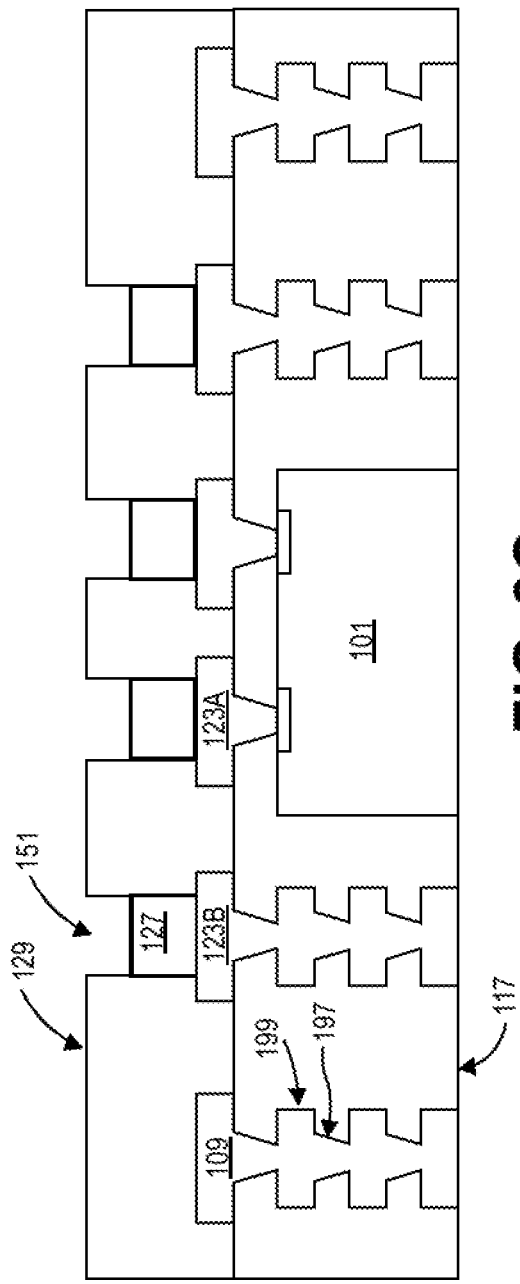

Moving on to FIG. 3C, a metallic material (e.g., copper, etc.) is deposited in the openings 151 to form litho-vias 127. The metallic material can be deposited using any suitable deposition technique, such as electroplating. With regard now to FIG. 3D, exposed portions of the resist layer 129 are stripped away to reveal exposed surfaces of the litho-vias 127, the package substrate, the contact pads 109, the contact pads 123A, and the contact pads 123B that are under the litho-vias 127. In one embodiment, the metallic surfaces of the litho-vias 127 may be roughened using a suitable roughening technique to promote adhesion of the metallic surfaces of the litho-vias 127 to another layer (e.g., a dielectric layer, a metal layer, etc.) that is positioned on, around, or above the litho-vias 127. In another embodiment, one or more adhesion promotion layers may be deposited on the metallic surfaces of the litho-vias 127 to another layer (e.g., a dielectric layer, a metal layer, etc.) that is positioned on, around, or above the litho-vias 127. An adhesion promotion layer may be an organic adhesion promotion layer, an inorganic adhesion promotion layer, or a combination thereof.

Referring now to FIG. 3E, a layer 131 is used to encapsulate the exposed surfaces of the litho-vias 127, the package substrate, the contact pads 109, the contact pads 123A, and the contact pads 123B that are under the litho-vias 127. The layer 131 can be a dielectric layer or a solder resist layer. In one embodiment, the layer 131 is laminated on the exposed surfaces of the litho-vias 127, the package substrate, the contact pads 109, the contact pads 123A, and the contact pads 123B that are under the litho-vias 127.

Figure 3F:
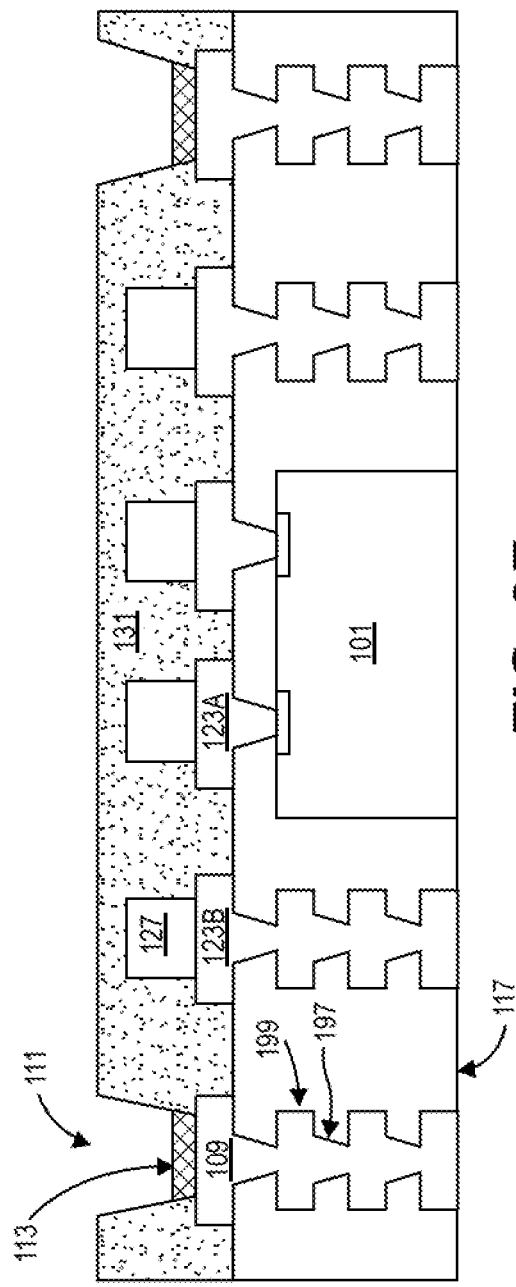

Next, in FIG. 3F, openings 111 are formed through the layer 131 to reveal the contact pads 109. In one embodiment, when the layer 131 is a dielectric layer, the openings 111 are formed using laser drilling techniques (e.g., ultraviolet (UV) laser drilling techniques, etc.). In this embodiment, the openings 111 have a V-shape. That is, each of the openings 111 has tapered sidewalls. In one embodiment, when the layer 131 is a solder resist layer, the openings 111 are formed using lithography techniques (e.g., photolithography techniques, etc.). In this embodiment, each of the openings 111 has two sidewalls that are substantially vertical. Following formation of the openings 111, a desmearing operation may be performed to clean the openings 111 of residue. Additionally, and although not shown in FIG. 3F, a solder resist layer may be laminated on the bottom side of the package substrate 101. Furthermore, and as shown in FIG. 3F, a surface finish 113 is disposed (e.g., plated, etc.) on the contact pads 109.

The layer 131 protects the litho-vias 127 from having the surface finish 113 disposed on the litho-vias 127. In this way, only the contact pads 109 have the surface finish 113 disposed thereon. This selective application can assist with eliminating application of the surface finish 113 to the litho-vias 127 and the contact pads 123A-123B associated with the bridge die 101. Eliminating application of the surface finish to the litho-vias 127 and the contact pads 123A-123B associated with the bridge die 101 assists with improving the electrical connections between the bridge die 101 and the semiconductor dies (not shown in FIG. 3F) coupled to the bridge die 101, which in turn assists with reducing yield loss.

Figure 3G:
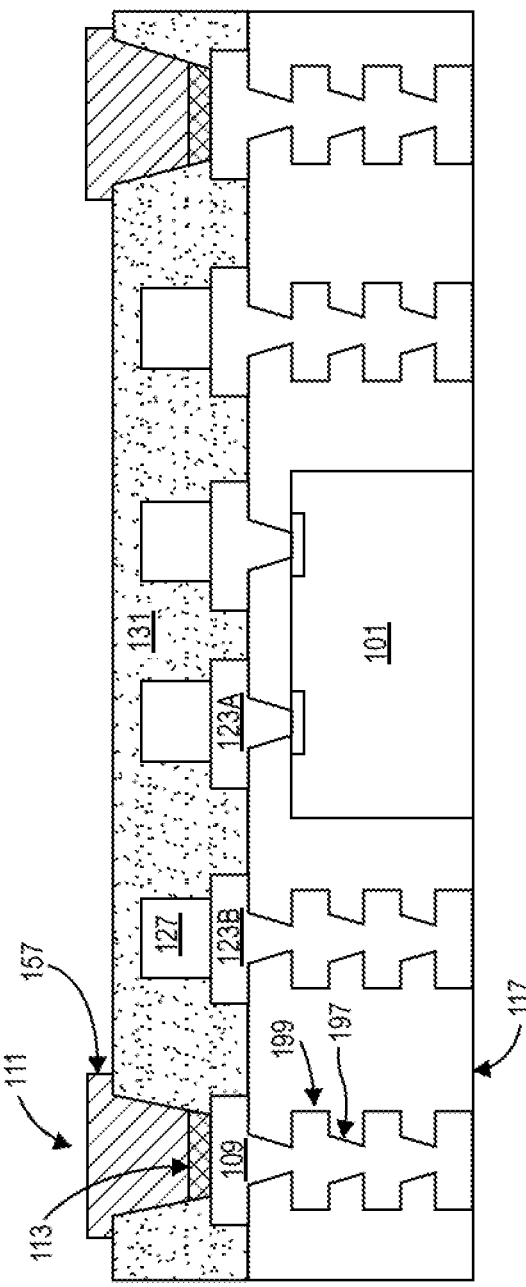

With regard now to FIG. 3G, an optional operation is shown. This optional operation includes disposing a protective material 157 in the openings 111 above the surface finish 113. The protective material 157 is used to protect the surface finish 113 from damage during use of a planarization technique, as described below in conjunction with FIG. 3H. In one embodiment, the protective material 157 is a photoresist. Moving on to FIG. 3H, in one embodiment, a planarization technique may be performed on the surface of the layer 131 and the surface of the protective material 157 to reveal surfaces of the litho-vias 127. The planarization technique may include use of a slurry, such as a mechanical planarization slurry, chemical planarization slurry, a chemical mechanical planarization (CMP) slurry, any other suitable slurry, or any combination of suitable slurries. In one embodiment, the protective material 157 protects the surface finish 113 from damage that may be caused by the slurry during performance of a planarization technique (e.g., mechanical planarization, chemical planarization, CMP, etc.). In one embodiment, when the protective material 157 is not used, a planarization operation may be performed on the surface of the layer 131 to reveal surfaces of the litho-vias 127. In one embodiment, after planarization is completed, surfaces of the litho-vias 127, the layer 131, and the protective material 157 are substantially co-planar. In another embodiment, when the protective material 157 is not used and after planarization is completed, surfaces of the litho-vias 127 and the layer 131 are substantially co-planar.

At FIG. 3I, when the protective material 157 is used, the process includes removing the protective material 157 to reveal the surface finish 113. In another embodiment, when the protective material 157 is not used, the surface finish 113 is already revealed. The process also includes fabricating contact pads 105 on the litho-vias 127 by depositing a metallic material (e.g., copper, etc.) via a suitable deposition technique (e.g., an electroless plating technique, an electroplating technique, etc.). Additionally, the process includes fabricating protruded interconnect structures 107 (e.g., bumps, pillars, etc.) on the contact pads 105 by a suitable deposition technique (e.g., an electroless plating technique, an electroplating technique, etc.). The protruded interconnect structures 107 may comprise nickel, tin, copper, any other suitable metal or alloy, or any combination thereof. Following formation of the protruded interconnect structures 107, a package substrate comprising litho-vias 127 and a selectively applied surface finish 113 is formed.

Figure 4:
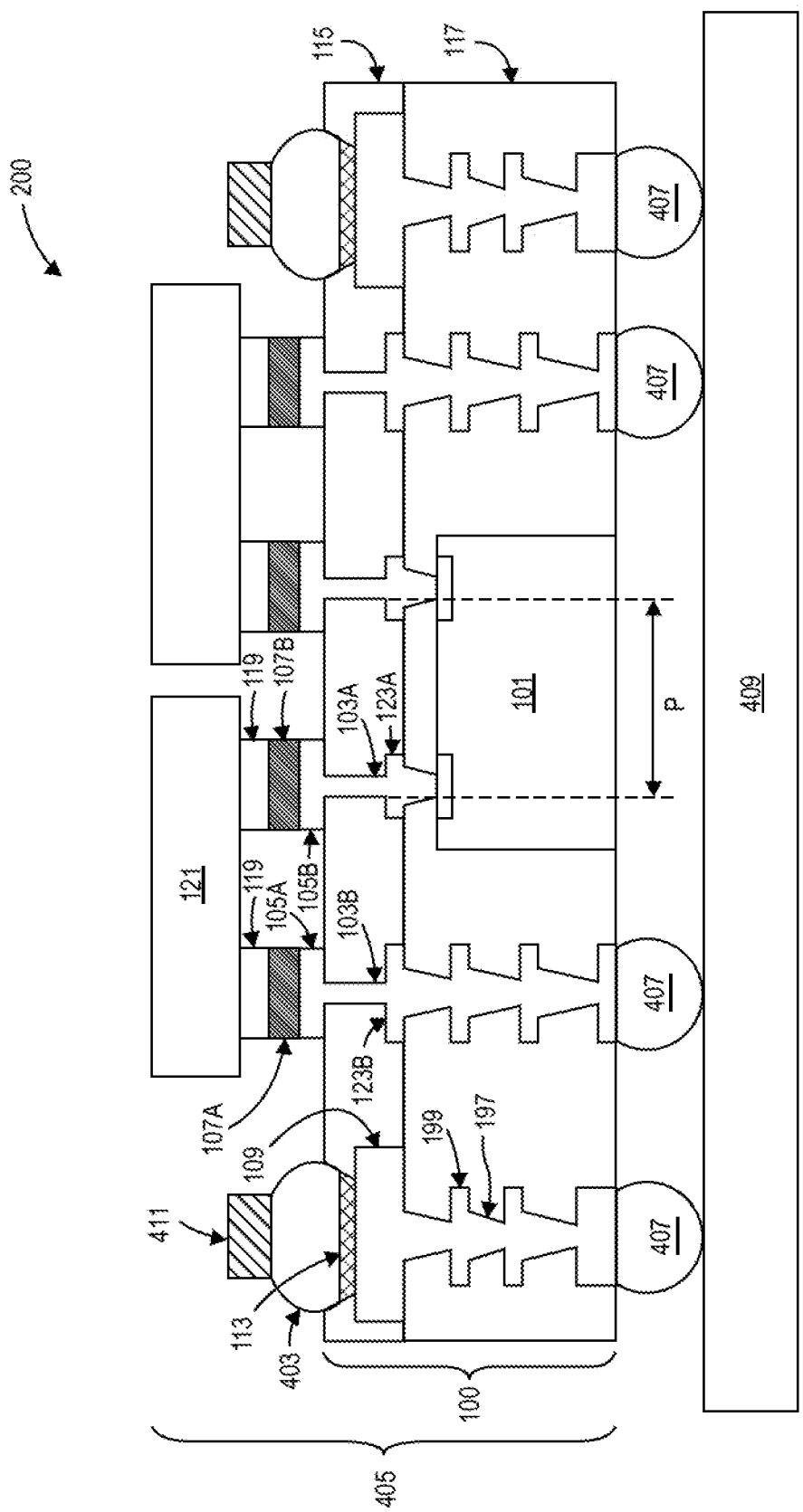
FIG. 4 illustrates a cross sectional view of a packaged system that comprises litho-vias for a bridge die FLI, according to one embodiment.

FIG. 4 illustrates a cross sectional view of a packaged system 400, according to one embodiment. As shown, the packaged system 400 includes: (i) a semiconductor package 405; (ii) a board 409; and (iii) a second level interconnect (SLI) 407 coupling the semiconductor package 405 and the board 409 to each other.

The semiconductor package 405 that is part of the packaged system 400 is similar to the semiconductor package 200 described above in connection with FIG. 2, with the exception that the semiconductor package 405 includes die side capacitors (DSCs) 411 positioned on the surface finish 113. In one embodiment, and as shown in FIG. 4, the DSCs 411 are coupled to the surface finish 113 via protruded interconnect structures 403. The protruded interconnect structures 403 can comprise bumps, pillars, etc. In one embodiment, and as shown in FIG. 4, the protruded interconnect structures 403 comprise bumps. The protruded interconnect structures 403 may be formed from solder, lead, tin, silver, copper, any combination thereof, etc.

In one embodiment, at least one of the DSCs 411 is a bypass capacitor designed to: (i) minimize noise and impedance; or (ii) maintain a constant voltage under various operating frequencies. The board 409 may be any type of board known in the art (e.g., a motherboard, a printed circuit board (PCB), etc.). The SLI 407 can comprise protruded interconnect structures, such as bumps, pillars, a pin grid array (PGA), a ball grid array (BGA), a land grid array (LGA), etc. In one embodiment, and as shown in FIG. 4, the protruded interconnect structures of the SLI 407 comprise bumps. The protruded interconnect structures of the SLI 407 may be formed from solder, lead, tin, silver, copper, any combination thereof, etc.

Figure 5:
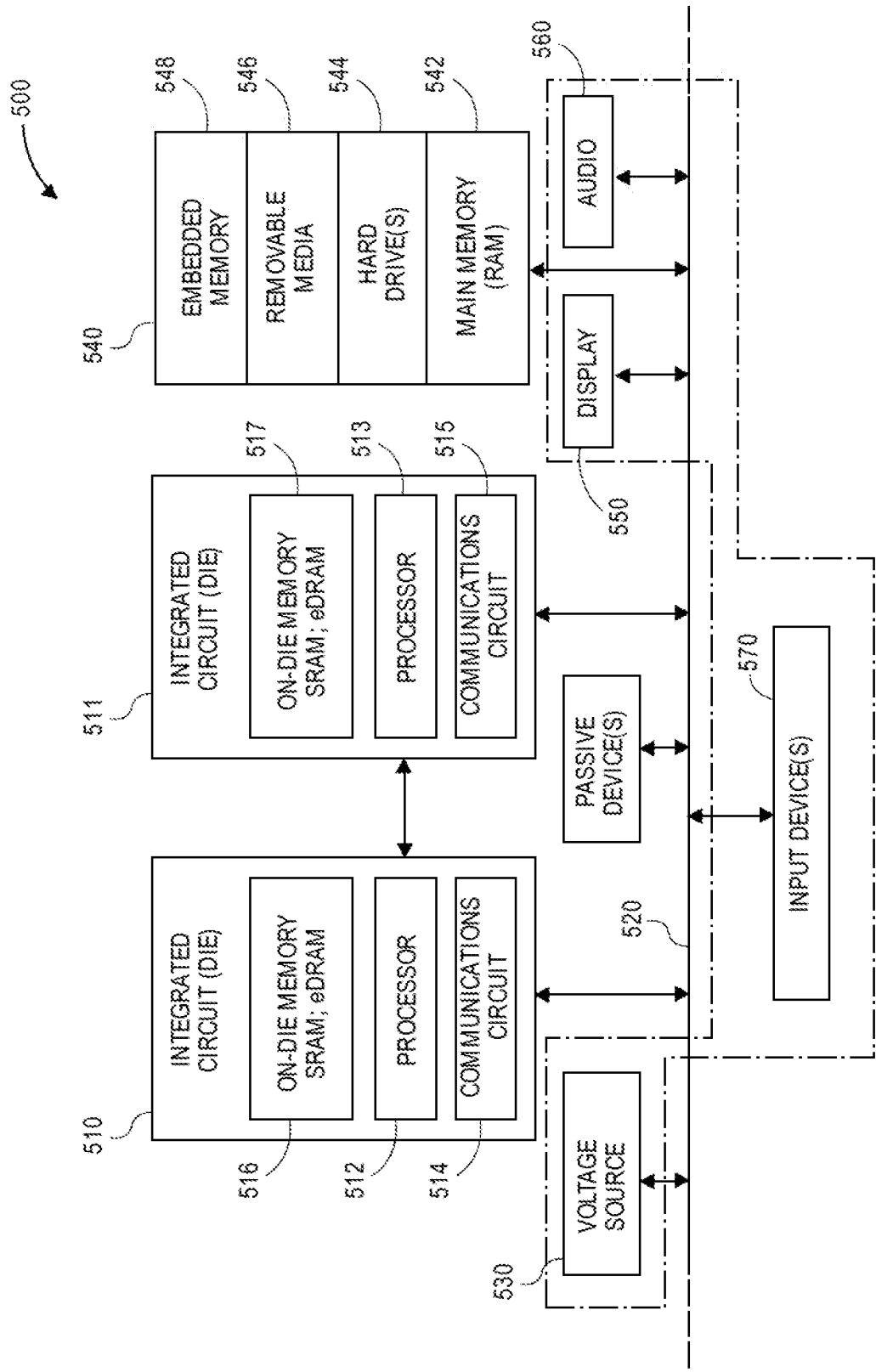
FIG. 5 is a schematic illustration of a computer system, according to one embodiment.

FIG. 5 is a schematic illustration of a computer system, according to one embodiment. FIG. 5 illustrates a schematic of computer system 500 according to an embodiment. The computer system 500 (also referred to as an electronic system 500) can include a semiconductor package comprising litho-vias for a bridge die FLI in accord with any of the embodiments and their equivalents as set forth in this disclosure. The computer system 500 may be a mobile device, a netbook computer, a wireless smart phone, a desktop computer, a hand-held reader, a server system, a supercomputer, or a high-performance computing system.

The system 500 can be a computer system that includes a system bus 520 to electrically couple the various components of the electronic system 500. The system bus 520 is a single bus or any combination of busses according to various embodiments. The electronic system 500 includes a voltage source 530 that provides power to the integrated circuit 510. In one embodiment, the voltage source 530 supplies current to the integrated circuit 510 through the system bus 520.

The integrated circuit 510 is electrically coupled to the system bus 520 and includes any circuit, or combination of circuits according to an embodiment. In an embodiment, the integrated circuit 510 includes a processor 512. As used herein, the processor 512 may mean any type of circuit such as, but not limited to, a microprocessor, a microcontroller, a graphics processor, a digital signal processor, or another processor. In an embodiment, the processor 512 includes, or is coupled with, a semiconductor package comprising litho-vias for a bridge die FLI in accordance with any of the embodiments and their equivalents, as described in the foregoing specification. In an embodiment, SRAM embodiments are found in memory caches of the processor. Other types of circuits that can be included in the integrated circuit 510 are a custom circuit or an application-specific integrated circuit (ASIC), such as a communications circuit 514 for use in wireless devices such as cellular telephones, smart phones, pagers, portable computers, two-way radios, and similar electronic systems, or a communications circuit for servers. In an embodiment, the integrated circuit 510 includes on-die memory 516 such as static random-access memory (SRAM). In an embodiment, the integrated circuit 510 includes embedded on-die memory 516 such as embedded dynamic random-access memory (eDRAM). In one embodiment, the on-die memory 516 may be packaged with a process in accordance with any of the embodiments and their equivalents, as described in the foregoing specification.

In an embodiment, the integrated circuit 510 is complemented with a subsequent integrated circuit 511. Useful embodiments include a dual processor 513 and a dual communications circuit 515 and dual on-die memory 517 such as SRAM. In an embodiment, the dual integrated circuit 510 includes embedded on-die memory 517 such as eDRAM.

In an embodiment, the electronic system 500 also includes an external memory 540 that may include one or more memory elements suitable to the particular application, such as a main memory 542 in the form of RAM, one or more hard drives 544, and/or one or more drives that handle removable media 546, such as diskettes, compact disks (CDs), digital variable disks (DVDs), flash memory drives, and other removable media known in the art. The external memory 540 may also be embedded memory 548 such as the first die in a die stack, according to an embodiment.

In an embodiment, the electronic system 500 also includes a display device 550 and an audio output 560. In an embodiment, the electronic system 500 includes an input device such as a controller 570 that may be a keyboard, mouse, trackball, game controller, microphone, voice-recognition device, or any other input device that inputs information into the electronic system 500. In an embodiment, an input device 570 is a camera, a digital sound recorder, or both.

At least one of the integrated circuits 510 or 511 can be implemented in a number of different embodiments, including a semiconductor package comprising litho-vias for a bridge die FLI as described herein, an electronic system, a computer system, one or more methods of fabricating an integrated circuit, and one or more methods of fabricating a semiconductor package comprising litho-vias for a bridge die FLI, according to any disclosed embodiments set forth herein and their art-recognized equivalents. The elements, materials, geometries, dimensions, and sequence of operations can all be varied to suit particular I/O coupling requirements including array contact count, array contact configuration for a microelectronic die embedded in a processor mounting substrate according to a semiconductor package comprising a stress absorption material in accordance with any of the disclosed embodiments as set forth herein and their art-recognized equivalents. A foundation substrate may be included, as represented by the dashed line of FIG. 5. Passive devices may also be included, as is also depicted in FIG. 5.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "In an embodiment," "for another embodiment," "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semiconductor dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures. As used herein, the phrases "A or B", "A and/or B", "one or more of A and B", and "at least one of A or B" means (A), (B), or (A and B).

Example embodiment 1: A package substrate, comprising: a bridge die embedded in the package substrate; a first contact pad outside a perimeter of the bridge die; and a second contact pad inside the perimeter of the bridge die and coupled to the bridge die by a first vertical interconnect access (via). The first contact pad has a surface finish disposed thereon. The first via has substantially vertical sidewalls. The second contact pad has a protruded interconnect structure positioned thereon.

Example embodiment 2: The package substrate of example embodiment 1, further comprising: a third contact pad inside the perimeter of the bridge die, adjacent to the second contact pad, and coupled to the bridge die by a second via having substantially vertical sidewalls. The third contact pad has a protruded interconnect structure positioned thereon.

Example embodiment 3: The package substrate of example embodiment 2, wherein a pitch between the first and second vias is less than or equal to 50 microns (μm).

Example embodiment 4: The package substrate of any one of example embodiments 2-3, further comprising: a dielectric layer surrounding the first and second vias.

Example embodiment 5: The package substrate of any one of example embodiments 2-3, further comprising: a solder resist layer surrounding the first and second vias.

Example embodiment 6: The package substrate of any one of example embodiments 1-5, wherein the surface finish comprises electroless nickel electroless palladium immersion gold (ENEPIG).

Example embodiment 7: The package substrate of any one of example embodiments 1-6, wherein the protruded interconnect structure comprises one or more of nickel, tin, and copper.

Example embodiment 8: The package substrate of any one of example embodiments 1-7, wherein the first contact pad is a die side capacitor pad.

Example embodiment 9: A semiconductor package, comprising: a package substrate; a bridge die embedded in the package substrate; a first contact pad outside of a perimeter of the bridge die; a second contact pad inside the perimeter of the bridge die and coupled to the bridge die by a first vertical interconnect access (via); a third contact pad inside the perimeter of the bridge die, adjacent to the second contact pad, and coupled to the bridge die by a second via; a first semiconductor die coupled to the package substrate by a first protruded interconnect structure; and a second semiconductor die coupled to the package substrate by a second protruded interconnect structure. The first contact pad has a surface finish disposed thereon. The first protruded interconnect structure is positioned on the first via. The second protruded interconnect structure is positioned on the second via.

Example embodiment 10: The semiconductor package of example embodiment 9, wherein a pitch between the first and second vias is less than or equal to 50 microns (μm).

Example embodiment 11: The semiconductor package of any one of example embodiments 9-10, wherein the first and second protruded interconnect structures directly contact the second and third contact pads, respectively.

Example embodiment 12: The semiconductor package of any one of example embodiments 9-11, further comprising: a dielectric layer surrounding the first and second vias.

Example embodiment 13: The semiconductor package of any one of example embodiments 9-11, further comprising: a solder resist layer surrounding the first and second vias.

Example embodiment 14: The semiconductor package of any one of example embodiments 9-13, wherein the surface finish comprises electroless nickel electroless palladium immersion gold (ENEPIG).

Example embodiment 15: The semiconductor package of any one of example embodiments 9-14, wherein each of the first and second protruded interconnect structures comprises one or more of nickel, copper, and tin.

Example embodiment 16: A method of forming a package substrate, comprising: embedding a bridge die in a package substrate, the package substrate having a first contact pad positioned over the bridge die and coupled to the bridge die, a second contact pad positioned over the bridge die and coupled to the bridge die, and a third pad positioned outside a perimeter of the bridge die; forming first and second vertical interconnect accesses (vias) simultaneously, wherein the first via is formed over the first contact pad and wherein the second via is formed over the second contact pad; laminating a layer on exposed surfaces of the package substrate, the first contact pad, the first via, the second contact pad, the second via, and the third pad; forming an opening over the third pad through the layer; disposing a surface finish on the third pad; and forming first and second protruded interconnect structures on the first and second vias, respectively.

Example embodiment 17: The method of example embodiment 16, wherein the first and second vias are formed using a lithography technique.

Example embodiment 18: The method of any one of example embodiments 16-17, wherein the opening is formed using a lithography technique or a laser drilling technique.

Example embodiment 19: The method of any one of example embodiments 16-18, further comprising: laminating a dry film resist (DFR) on exposed surfaces of the package substrate, the first contact pad, the second contact pad, and the third pad; lithographically processing the DFR to create openings above the first contact pad and the second contact pad, wherein forming the first and second vias simultaneously comprises depositing a metallic material in the openings to form the first via on the first contact pad and the second via on the second contact pad; stripping the DFR; and planarizing the layer to reveal the first via and the second via.

Example embodiment 20: The method of example embodiment 19, wherein the layer comprises a dielectric layer or a solder resist layer.

Example embodiment 21: The method of any one of example embodiments 17-20, wherein a pitch between the first and second vias is less than or equal to 50 microns (μm).

Example embodiment 22: A packaged system, comprising: a printed circuit board (PCB); and a semiconductor package coupled to the PCB. The semiconductor package comprises: a package substrate; a bridge die embedded in the package substrate; a first contact pad outside a perimeter of the bridge die; a second contact pad inside the perimeter of the bridge die and coupled to the bridge die by a first via; a third pad inside the perimeter of the bridge die, adjacent to the second contact pad, and coupled to the bridge die by a second via; a first semiconductor die coupled to the package substrate by a first protruded interconnect structure; and a second semiconductor die coupled to the package substrate by a second protruded interconnect structure. The first contact pad has a surface finish disposed thereon. The first protruded interconnect structure is positioned on the first via. The second protruded interconnect structure is positioned on the second via.

Example embodiment 23: The packaged system of example embodiment 22, wherein a pitch between the first and second vias is less than or equal to 50 microns (μm).

Example embodiment 24: The packaged system of any one of example embodiments 22-23, wherein the first and second protruded interconnect structures directly contact the second and third pads, respectively.

Example embodiment 25: The packaged system of any one of example embodiments 22-24, further comprising: a dielectric layer or a solder resist layer surrounding the first and second vias.

The invention claimed is:

1. A package substrate, comprising:
a bridge die embedded in the package substrate;
a first contact pad outside a perimeter of the bridge die, the first contact pad having an uppermost surface with a surface finish disposed directly thereon, wherein the uppermost surface of the first contact pad is above a top of the bridge die, the first contact pad in a dielectric layer, the dielectric layer over the bridge die;
a second contact pad inside the perimeter of the bridge die and coupled to the bridge die by a first via, a lower contact pad and a lower via, the first via on the lower pad, and the lower pad on the lower via, and the first via having substantially vertical sidewalls, and the second contact pad having a protruded interconnect structure positioned thereon, wherein the second contact pad has a bottommost surface above the uppermost surface of the first contact pad, and wherein the first via and the lower contact pad coupled to the second contact pad are in the dielectric layer, and the second contact pad is above the dielectric layer; and
a third contact pad outside the perimeter of the bridge die, the third contact pad laterally between but not vertically overlapping with the first contact pad and the second contact pad, and the third contact pad coupled to a first via, a lower contact pad and a lower via, the first via on the lower pad, and the lower pad on the lower via, and the first via having substantially vertical sidewalls, and the third contact pad having a protruded interconnect structure positioned thereon, wherein the third contact pad has an uppermost surface at the same level as the uppermost surface of the second contact pad, and wherein the first via and the lower contact pad coupled to the third contact pad are in the dielectric layer, and the third contact pad is above the dielectric layer.

2. The package substrate of claim 1, further comprising:
a fourth contact pad inside the perimeter of the bridge die, adjacent to the second contact pad, and coupled to the bridge die by a via having substantially vertical sidewalls, the fourth contact pad having a protruded interconnect structure positioned thereon.

3. The package substrate of claim 2, wherein a pitch between the first and second vias is less than or equal to 50 microns (μm).

4. The package substrate of claim 2, further comprising:
a solder resist layer surrounding the first and second vias.

5. The package substrate of claim 1, wherein the surface finish comprises electroless nickel electroless palladium immersion gold (ENEPIG).

6. The package substrate of claim 1, wherein the protruded interconnect structure comprises one or more of nickel, tin, and copper.

7. The package substrate of claim 1, wherein the first contact pad is a die side capacitor pad.

8. A semiconductor package, comprising:
a package substrate;
a bridge die embedded in the package substrate;
a first contact pad outside of a perimeter of the bridge die, the first contact pad having an uppermost surface with a surface finish disposed directly thereon, wherein the uppermost surface of the first contact pad is above a top of the bridge die, the first contact pad in a dielectric layer, the dielectric layer over the bridge die;
a second contact pad inside the perimeter of the bridge die and coupled to the bridge die by a first via, a lower contact pad and a lower via, the first via on the lower pad, and the lower pad on the lower via, wherein a first protruded interconnect structure is positioned on the first via, and wherein the second contact pad has a bottommost surface above the uppermost surface of the first contact pad, and wherein the first via and the lower contact pad coupled to the second contact pad are in the dielectric layer, and the second contact pad is above the dielectric layer;
a third contact pad inside the perimeter of the bridge die, adjacent to the second contact pad, and coupled to the bridge die by a second via, wherein a second protruded interconnect structure is positioned on the second via;
a fourth contact pad outside the perimeter of the bridge die, the fourth contact pad laterally between but not vertically overlapping with the first contact pad and the second contact pad, and the fourth contact pad coupled to a first via, a lower contact pad and a lower via, the first via on the lower pad, and the lower pad on the lower via, and the fourth contact pad having a protruded interconnect structure positioned thereon, wherein the fourth contact pad has an uppermost surface at the same level as the uppermost surface of the second contact pad, and wherein the first via and the lower contact pad coupled to the fourth contact pad are in the dielectric layer, and the fourth contact pad is above the dielectric layer;
a first semiconductor die coupled to the package substrate by the first protruded interconnect structure; and
a second semiconductor die coupled to the package substrate by the second protruded interconnect structure.

9. The semiconductor package of claim 8, wherein a pitch between the first and second vias is less than or equal to 50 microns (μm).

10. The semiconductor package of claim 8, wherein the first and second protruded interconnect structures directly contact the second and third contact pads, respectively.

11. The semiconductor package of claim 8, further comprising:
a solder resist layer surrounding the first and second vias.

12. The semiconductor package of claim 8, wherein the surface finish comprises electroless nickel electroless palladium immersion gold (ENEPIG).

13. The semiconductor package of claim 8, wherein each of the first and second protruded interconnect structures comprises one or more of nickel, copper, and tin.

14. A packaged system, comprising:
a printed circuit board (PCB); and
a semiconductor package coupled to the PCB, the semiconductor package comprising:
a package substrate;
a bridge die embedded in the package substrate;
a first contact pad outside a perimeter of the bridge die, the first contact pad having an uppermost surface with a surface finish disposed directly thereon, wherein the uppermost surface of the first contact pad is above a top of the bridge die, the first contact pad in a dielectric layer, the dielectric layer over the bridge die;
a second contact pad inside the perimeter of the bridge die and coupled to the bridge die by a first via, a lower contact pad and a lower via, the first via on the lower pad, and the lower pad on the lower via, wherein a first protruded interconnect structure is positioned on the first via, and wherein the second contact pad has a bottommost surface above the uppermost surface of the first contact pad, and wherein the first via and the lower contact pad coupled to the second contact pad are in the dielectric layer, and the second contact pad is above the dielectric layer;
a third contact pad inside the perimeter of the bridge die, adjacent to the second contact pad, and coupled to the bridge die by a second via, wherein a second protruded interconnect structure is positioned on the second via;
a fourth contact pad outside the perimeter of the bridge die, the fourth contact pad laterally between but not vertically overlapping with the first contact pad and the second contact pad, and the fourth contact pad coupled to a first via, a lower contact pad and a lower via, the first via on the lower pad, and the lower pad on the lower via, and the fourth contact pad having a protruded interconnect structure positioned thereon, wherein the fourth contact pad has an uppermost surface at the same level as the uppermost surface of the second contact pad, and wherein the first via and the lower contact pad coupled to the fourth contact pad are in the dielectric layer, and the fourth contact pad is above the dielectric layer;
a first semiconductor die coupled to the package substrate by the first protruded interconnect structure; and
a second semiconductor die coupled to the package substrate by the second protruded interconnect structure.

15. The packaged system of claim 14, wherein a pitch between the first and second vias is less than or equal to 50 microns (μm).

16. The packaged system of claim 14, wherein the first and second protruded interconnect structures directly contact the second and third pads, respectively.

17. A method of forming a package substrate, the method comprising:
embedding a bridge die in the package substrate;
positioning a first contact pad outside a perimeter of the bridge die, the first contact pad having an uppermost surface with a surface finish disposed directly thereon, wherein the uppermost surface of the first contact pad is above a top of the bridge die, the first contact pad in a dielectric layer, the dielectric layer over the bridge die;
positioning a second contact pad inside the perimeter of the bridge die and coupled to the bridge die by a first via, a lower contact pad and a lower via, the first via on the lower pad, and the lower pad on the lower via, and the first via having substantially vertical sidewalls, and the second contact pad having a protruded interconnect structure positioned thereon, wherein the second contact pad has a bottommost surface above the uppermost surface of the first contact pad, and wherein the first via and the lower contact pad coupled to the second contact pad are in the dielectric layer, and the second contact pad is above the dielectric layer; and
positioning a third contact pad outside the perimeter of the bridge die, the third contact pad laterally between but not vertically overlapping with the first contact pad and the second contact pad, and the third contact pad coupled to a first via, a lower contact pad and a lower via, the first via on the lower pad, and the lower pad on the lower via, and the first via having substantially vertical sidewalls, and the third contact pad having a protruded interconnect structure positioned thereon, wherein the third contact pad has an uppermost surface at the same level as the uppermost surface of the second contact pad, and wherein the first via and the lower contact pad coupled to the third contact pad are in the dielectric layer, and the third contact pad is above the dielectric layer.

18. The method of claim 17, further comprising positioning a fourth contact pad inside the perimeter of the bridge die, adjacent to the second contact pad, and coupled to the bridge die by a via having substantially vertical sidewalls, the fourth contact pad having a protruded interconnect structure positioned thereon.

19. The method of claim 18, wherein a pitch between the first and second vias is less than or equal to 50 microns (μm).

20. The method of claim 18, further comprising:
surrounding the first and second vias with a solder resist layer.

21. The method of claim 17, wherein the surface finish comprises electroless nickel electroless palladium immersion gold (ENEPIG).

22. The method of claim 17, wherein the protruded interconnect structure comprises one or more of nickel, tin, and copper.

23. The method of claim 17, wherein the first contact pad is a die side capacitor pad.

* * * * *